United States Patent
Chen et al.

(10) Patent No.: US 9,865,214 B2
(45) Date of Patent: Jan. 9, 2018

(54) SHIFT REGISTER, DRIVING METHOD THEREOF, GATE DRIVING CIRCUIT AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Peng Chen, Beijing (CN); Xinxia Zhang, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/259,073

(22) Filed: Sep. 8, 2016

(65) Prior Publication Data
US 2017/0213515 A1 Jul. 27, 2017

(30) Foreign Application Priority Data
Jan. 26, 2016 (CN) .......................... 2016 1 0053004

(51) Int. Cl.
G09G 3/36 (2006.01)
G11C 19/28 (2006.01)

(52) U.S. Cl.
CPC ......... *G09G 3/3677* (2013.01); *G09G 3/3648* (2013.01); *G11C 19/28* (2013.01); *G09G 2300/0809* (2013.01); *G09G 2310/0286* (2013.01); *G09G 2310/0289* (2013.01); *G09G 2310/08* (2013.01); *G09G 2330/021* (2013.01)

(58) Field of Classification Search
CPC ............... G09G 3/3677; G09G 3/3648; G09G 2310/0286; G09G 2310/08; G09G 2330/021; G11C 19/28
See application file for complete search history.

(56) References Cited

U.S. PATENT DOCUMENTS

| | | | |
|---|---|---|---|
| 2005/0008114 A1* | 1/2005 | Moon ................. | G09G 3/3677 377/64 |
| 2007/0147573 A1* | 6/2007 | Tobita ................. | G09G 3/3648 377/64 |
| 2009/0073105 A1* | 3/2009 | Chiang ................ | G11C 19/28 345/100 |
| 2010/0007653 A1* | 1/2010 | Ahn .................... | G09G 3/3677 345/214 |

* cited by examiner

*Primary Examiner* — Shaheda Abdin
(74) *Attorney, Agent, or Firm* — Brooks Kushman P.C.

(57) ABSTRACT

A shift register unit includes: a pull-up node control unit; a pull-down control node control unit connected with a first level output terminal, and configured to control an electrical potential at a pull-down control node to be a second level when an electrical potential at a pull-up node is a first level, and to control a pull-down control node to be connected with a first level output terminal when the electrical potential at the pull-up node is a third level; a pull-down node control unit; a gate driving signal output unit; and a carry signal output unit configured to control a carry signal output terminal to output a carry signal under the control of the pull-up node and the pull-down node. The carry signal output terminal provides an input signal to a shift register unit in an adjacent next stage.

20 Claims, 5 Drawing Sheets

SHIFT REGISTER, DRIVING METHOD THEREOF, GATE DRIVING CIRCUIT AND DISPLAY DEVICE

CROSS-REFERENCE TO RELATED APPLICATIONS

This application claims priority to Chinese application No. 201610053004.5, filed Jan. 26, 2016, which is hereby incorporated by reference in its entirety.

TECHNICAL FIELD

The present disclosure relates to the field of display technique, and in particular, relates to a shift register, a driving method thereof, a gate driving circuit, and a display device.

BACKGROUND

In a display device in the related art, a gate driver transforms inputted clock signals to ON/OFF voltage signals through transition performed by shift register units, and sequentially applies the ON/OFF voltage signals to gate lines of a liquid crystal panel. The shift register units in the gate driver generate gate driving signals for scanning the gate lines.

The shift register unit in the related art cannot achieve completely discharging and denoising of pull-up nodes in a non-outputting stage, and because an input signal is provided to a shift register unit in the next stage directly through a gate driving signal output terminal, such that a size of a transistor for outputting a gate driving signal is required to be relatively large, causing a size and a power consumption of the shift register unit in the related art to be large and not being conducive to implementation of low power consumption and narrow frame.

SUMMARY

The present disclosure is intended to provide a shift register, a driving method thereof, a gate driving circuit and a display device, so as to solve such a technical problem that a shift register unit in the related art cannot completely discharge and denoise a pull-up node in a non-output phase, causing a power consumption and a size of the shift register unit in the related art relatively large and not being conducive to implementation of low power consumption and narrow frame.

To achieve the above purpose, the present disclosure provides a shift register unit which includes an input terminal, a reset terminal, a first level output terminal, a carry signal output terminal and a gate driving signal output terminal. The shift register unit further includes: a pull-up node control unit connected with the input terminal, the reset terminal and a pull-up node; a pull-down control node control unit connected with the first level output terminal, the pull-up node, and the pull-down control node, and configured to control an electrical potential at the pull-down control node to be a second level when an electrical potential at the pull-up node is a first level, and to control the pull-down control node to be connected with the first level output terminal when the electrical potential at the pull-up node is a third level; a pull-down node control unit connected with the pull-down control node, the first level output terminal, the pull-up node and the pull-down node, and configured to control an electrical potential at the pull-down node to be the second level when an electrical potential at the pull-up node is the first level, and to control the pull-down node to be connected with the first level output terminal when the electrical potential at the pull-down control node is the first level; a gate driving signal output unit connected with the pull-up node, the pull-down node, and the gate driving signal output terminal, and configured to control the gate driving signal output terminal to output a gate driving signal, under the control of the pull-up node and the pull-down node; and a carry signal output unit connected with the carry signal output terminal, the pull-up node, and the pull-down node, and configured to control the carry signal output terminal to output a carry signal, under the control of the pull-up node and the pull-down node, the carry signal output terminal providing an input signal to a shift register unit in an adjacent next stage.

Further, the carry signal output unit is further connected with the reset terminal, and is further configured to control the carry signal output terminal to output the third level when a reset signal inputted at the reset terminal has the first level.

Further, the pull-down control node control unit includes: a first pull-down control node control transistor that includes a gate electrode connected with the pull-up node, a first electrode connected with the pull-down control node, and a second electrode receiving the second level; and a second pull-down control node control transistor that includes a gate electrode connected with the first level output terminal, a first electrode connected with the first level output terminal, and a second electrode connected with the pull-down control node.

Further, the pull-down node control unit includes: a first pull-down node control transistor that includes a gate electrode connected with the pull-up node, a first electrode connected with the pull-down node, and a second electrode receiving the second level; and a second pull-down node control transistor that includes a gate electrode connected with the pull-down control node, and a first electrode connected with the first level output terminal, and a second electrode connected with the pull-down node.

Further, the carry signal output unit includes: a first carry signal output transistor that includes a gate electrode connected with the pull-up node, a first electrode connected with a clock signal input terminal, and a second electrode connected with the carry signal output terminal; and a second carry signal output transistor that includes a gate electrode connected with the pull-down node, a first electrode connected with the carry signal output terminal, and a second electrode receiving a third level.

Further, the carry signal output unit further includes a third carry signal output transistor that includes a gate electrode connected with the reset terminal, a first electrode connected with the carry signal output terminal, and a second electrode receiving the third level.

Further, the gate driving signal output unit is further connected with a clock signal input terminal; a duty cycle of a clock signal inputted at the clock signal input terminal is smaller than 0.5; the gate driving signal output unit includes: a first gate driving signal output transistor that includes a gate electrode connected with the pull-up node, a first electrode connected with a clock signal input terminal, and a second electrode connected with the gate driving signal output terminal; and a second gate driving signal output transistor that includes a gate electrode connected with the pull-down node, a first electrode connected with the gate driving signal output terminal, and a second electrode receiving the second level.

Further, the gate driving signal output unit is further connected with a clock signal input terminal. The gate driving signal output unit includes: a first gate driving signal output transistor that includes a gate electrode connected with the pull-up node, a first electrode connected with a clock signal input terminal, and a second electrode connected with the gate driving signal output terminal; a second gate driving signal output transistor that includes a gate electrode connected with the pull-down node, a first electrode connected with the gate driving signal output terminal, and a second electrode receiving the second level; and a gate driving discharging transistor that includes a gate electrode connected with the reset terminal, a first electrode connected with the gate driving signal output terminal, and a second electrode receiving the second level.

Further, an input signal is inputted at the input terminal and a reset signal is inputted at the reset terminal; the pull-up node control unit is configured to control an electrical potential at the pull-up node to be the first level in an input phase under the control of the input signal, control a bootstrapping of the electrical potential at the pull-up node in an output phase, control the electrical potential at the pull-up node to be a third level in a reset phase under the control of the reset signal, and control the electrical potential at the pull-up node to be maintained at the third level in an output cutting-off and keeping phase.

The present disclosure also provides a method for driving a shift register unit, and the method includes: when an electrical potential at a pull-up node is a first level, controlling, by a pull-down control node control unit, an electrical potential at a pull-down control node to be a second level; when the electrical potential at the pull-up node is a third level, controlling, by the pull-down control node control unit, the pull-down control node to be connected with a first level output terminal; when the electrical potential at the pull-up node is the first level, controlling, by the pull-down node control unit, the electrical potential at the pull-down node to be the second level; when the electrical potential at the pull-down control node is the first level, controlling, by the pull-down node control unit, the pull-down node to be connected with the first level output terminal; under the control of the pull-up node and the pull-down node, controlling, by a carry signal output unit, a carry signal output terminal to output a carry signal, and providing, by the carry signal output terminal, an input signal to a shift register unit in an adjacent next stage.

Further, the method further includes: in an input phase, controlling, by the pull-up node control unit under the control of an input signal inputted at an input terminal, the electrical potential at the pull-up node to be the first level; in an output phase, controlling, by the pull-up node control unit, a bootstrapping of the electrical potential at the pull-up node; in a reset phase, controlling, by the pull-up node control unit under the control of a reset signal inputted at a reset terminal, the electrical potential at the pull-up node to be the third level; and in an output cutting off and keeping phase, controlling, by the pull-up node control unit, the electrical potential at the pull-up node to be maintained at the third level.

Further, the step of when the electrical potential at the pull-up node is the first level, controlling, by the pull-down control node control unit, the electrical potential at the pull-down control node to be the second level; when the electrical potential at the pull-up node is the third level, controlling, by the pull-down control node control unit, the pull-down control node to be connected with the first level output terminal includes: in the input phase and in the output phase, controlling, by the pull-down control node control unit, the electrical potential at the pull-down control node to be the second level; and in the reset phase and in the output cutting-off and keeping phase, controlling, by the pull-down control node control unit, the pull-down control node to be connected with the first level output terminal.

Further, the step of when the electrical potential at the pull-up node is the first level, controlling, by the pull-down node control unit, the electrical potential at the pull-down node to be the second level; when the electrical potential at the pull-down control node is the first level, controlling, by the pull-down node control unit, the pull-down node to be connected with the first level output terminal includes: in the input phase and in the output phase, controlling, by the pull-down node control unit, the electrical potential at the pull-down node to be the second level; and in the reset phase and in the output cutting-off and keeping phase, controlling, by the pull-down node control unit, the pull-down node to be connected with the first level output terminal.

Further, the step of under the control of the pull-up node and the pull-down node, controlling, by the carry signal output unit, the carry signal output terminal to output a carry signal, and providing, by the carry signal output terminal, an input signal to a shift register unit in an adjacent next stage includes: in the input phase and in the output phase, controlling, by the carry signal output unit, the carry signal output terminal to output the clock signal; and in the reset phase and in the output cutting-off and keeping phase, controlling, by the carry signal output unit, the carry signal output terminal to output the third level.

The present disclosure further provides a gate driving circuit which includes multiple stages of the above mentioned shift register unit.

The present disclosure also provides a display device including the above mentioned gate driving circuit.

The shift register, a driving method thereof, a gate driving circuit and a display device provided in the present disclosure employ a first level output terminal to consistently make a pull-down node to be at a first level (the first level may control turning on of a transistor for discharging and denoising a pull-up node) in a non-output phase, thereby accomplishing the discharging and denoising of the pull-up node in the non-output phase. The present disclosure employs the carry signal output terminal instead of the gate driving signal output terminal in the related art to provide the input signal to the shift register unit in the next stage, thereby decreasing the size of the output transistor included in the gate driving signal output unit and further reducing the power consumption and size of the whole shift register units and meeting the requirement of a product having low-power consumption and narrow frame.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

Technical solutions of embodiments of the present disclosure will be described clearly and briefly hereinafter with respect to the drawings of the embodiments of the present disclosure. Obviously, the described embodiments are only a part, but not all, of the embodiments of the present disclosure. All other embodiments obtained by one skilled in the art without paying any creative labor based on the embodiments of the present disclosure fall into the scope of the present disclosure.

Figure 1:
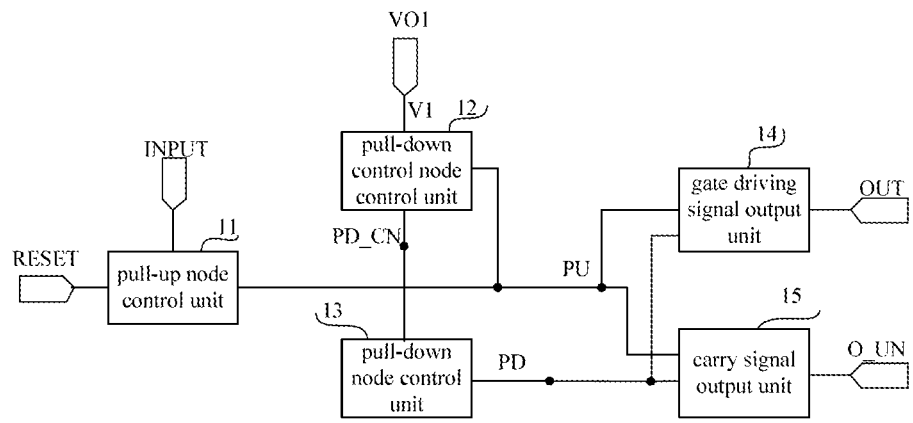
FIG. 1 is a structural diagram of a shift register unit of one embodiment of the present disclosure.

As shown in FIG. 1, a shift register unit of one embodiment of the present disclosure includes an input terminal INPUT, a reset terminal RESET, a first level output terminal VO1, a carry signal output terminal O_UN, and a gate driving signal output terminal OUT. The shift register unit further includes a pull-up node control unit 11, a pull-down control node control unit 12, a pull-down node control unit 13, a gate driving signal output unit 14 and a carry signal output unit 15.

The pull-up node control unit 11 is connected with the input terminal INPUT, the reset terminal RESET and the pull-up node PU.

The pull-down control node control unit 12 is connected with the first level output terminal VO1, the pull-up node PU, and the pull-down control node PD_CN, respectively. The pull-down control node control unit 12 is configured to control an electrical potential of the pull-down control node PD_CN to be a second level V2 when an electrical potential at the pull-up node PU is a first level V1. The pull-down control node control unit 12 is further configured to control the pull-down control node PD_CN to be connected with the first level output terminal VO1 when an electrical potential at the pull-up node PU is a third level V3.

The pull-down node control unit 13 is connected with the pull-down control node PD_CN, the first level output terminal VO1, the pull-up node PU and the pull-down node PD, respectively. The pull-down node control unit 13 is configured to control an electrical potential at the pull-down node PD to be the second level V2 when the electrical potential at the pull-up node PU is the first level V1. The pull-down node control unit 13 is further configured to control the pull-down node PD to be connected with the first level output terminal VO1 when the electrical potential at the pull-down control node PD_CN is the first level V1.

The gate driving signal output unit 14 is connected with the pull-up node PU, the pull-down node PD, and the gate driving signal output terminal OUT, respectively. The gate driving signal output unit 14 is further configured to control the gate driving signal output terminal OUT to output the gate driving signal, under the control of the pull-up node PU and the pull-down node PD.

The carry signal output unit 15 is connected with the carry signal output terminal O_UN, the pull-up node PU, and the pull-down node PD, respectively. The carry signal output unit 15 is configured to control the carry signal output terminal O_UN to output a carry signal, under the control of the pull-up node PU and the pull-down node PD. The carry signal output terminal O_UN provides an input signal to a shift register unit in an adjacent next stage.

The shift register unit of one embodiment of the present disclosure employs the first level output terminal to consistently make the pull-down node PD to be at the first level (the first level can control turning on of a transistor for discharging and denoising the pull-up node PU) in a non-outputting phase, thereby accomplishing discharging and denoising the pull-up node PU in the non-outputting phase. The shift register unit of one embodiment of the present disclosure is provided with not only the gate driving signal output terminal, but also the carry signal output terminal O_UN, so that through the carry signal output terminal O_UN, a reset signal can be provided to the shift register unit in the previous stage and an input signal can be provided to the shift register unit in the next stage, and a better charging-discharging effect can be achieved. Further, in one embodiment of the present disclosure, the shift register unit employs the carry signal output terminal instead of the gate driving signal output terminal in the related art to provide the input signal to the shift register unit in the next stage, thereby decreasing a size of an output transistor included in the gate driving signal output unit and then further reducing power consumption and size of the whole shift register units and meeting an requirement of a product having low power consumption and narrow frame.

According to a specific implementation, in case that output transistors (i.e., a transistor included in the gate driving signal output unit, a gate of which is connected with the pull-up node; a transistor included in the gate driving signal output unit, a gate of which is connected with the pull-down node; a transistor included in the carry signal output unit, a gate of which is connected with the pull-up node; and a transistor included in the carry signal output unit, a gate of which is connected with the pull-down node) in the example of the shift register unit shown in FIG. 1 of the present disclosure are N-type transistors, the first level may be a high level, the third level may be a first low level VGL1, and the second level may be a second low level VGL2. However, in one embodiment of the present disclosure, the output transistors included in the shift register unit may be P-type transistors. In such a case, the electrical potentials of the first level, the second level and the third level are only needed to be adjusted accordingly. Such specific example is only used as illustration, but not as limitation to the type of the transistors and the values of levels of the transistors.

Figure 2:
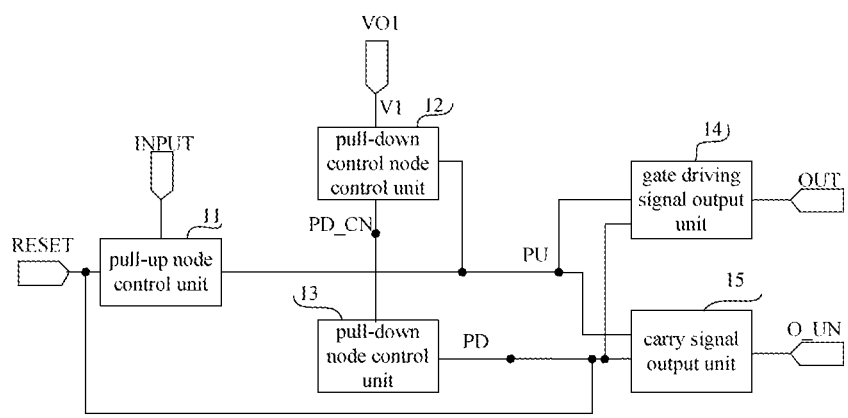
FIG. 2 is a circuit diagram of a shift register unit of at least some embodiments of the present disclosure.

Specifically, as shown in FIG. 2, the carry signal output unit 15 is also connected with the reset terminal RESET. The carry signal output unit 15 is further configured to control the carry signal output terminal O_UN to output the third level when the reset signal inputted at the reset terminal RESET has the first level, so as to reset the carry signal by the reset signal inputted at the reset terminal RESET.

Figure 3:
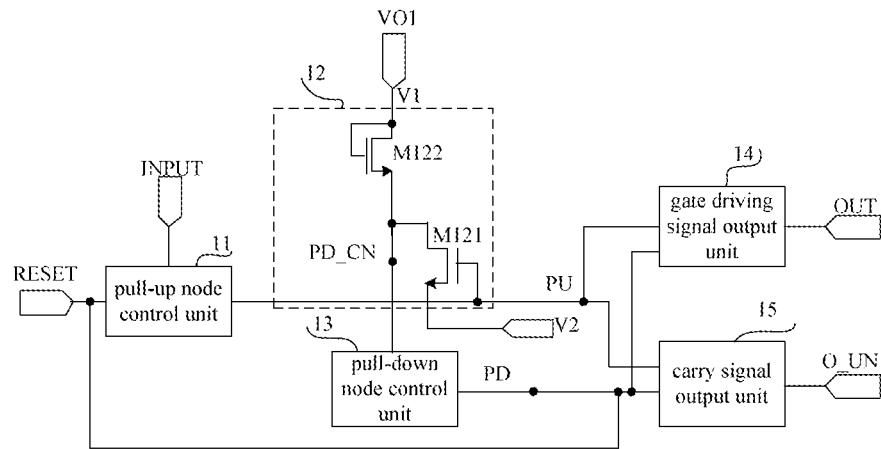
FIG. 3 is a circuit diagram of a shift register unit of at least some embodiments of the present disclosure.

Specifically, as shown in FIG. 3, the pull-down control node control unit 12 includes a first pull-down control node control transistor M121 and a second pull-down control node control transistor M122.

A gate of the first pull-down control node control transistor M121 is connected with the pull-up node PU. A first electrode of the first pull-down control node control transistor M121 is connected with the pull-down control node PD_CN. A second electrode of the first pull-down control node control transistor M121 is connected with the second level V2.

Both a gate and a first electrode of the second pull-down control node control transistor M122 are connected with the first level output terminal VO1. A second electrode of the second pull-down control node control transistor M122 is connected with the pull-down control node PD_CN.

Although the embodiment shown in FIG. 3 is illustrated by instancing the transistors M121 and M122 of N-type, the transistor M121 and M122 may also be P-type transistors in actual operations.

Under the circumstances that the transistors M121 and M122 are N-type transistors, V1 may be a high level VDD and V2 may be the second low level VGL2.

The first pull-down control node control transistor M121 is turned on when the electrical potential at the pull-up node PU is a high level, thereby controlling the pull-down control node PD_CN to receive the second low level VGL2.

The second pull-down control node control transistor M122 is to control the electrical potential at the pull-down node PD_CN to be the high level VDD when the electrical potential at the pull-up node PU is a low level. The second pull-down control node control transistor M122 is further to control the pull-down node control unit to set the electrical potential at the pull-down node PD as a high level, thereby achieving discharging and denoising the pull-up node PU at the non-outputting phase.

Specifically, the pull-down node control unit includes a first pull-down node control transistor and second pull-down node control transistor.

A gate of the first pull-down node control transistor is connected with the pull-up node. A first electrode of the first pull-down node control transistor is connected with the pull-down node. A second electrode of the first pull-down node control transistor is connected with the second level.

A gate of the second pull-down node control transistor is connected with the pull-down control node. A first electrode of the second pull-down node control transistor is connected with the first level output terminal. A second electrode of the second pull-down node control transistor is connected with the pull-down node.

Under the circumstances that both the first pull-down node control transistor and the second pull-down node control transistor are of N-type, the second level is the second low level. When the electrical potential at the pull-up node is a high level, the first pull-down node control transistor is turned on to control the pull-down node to receive the second low level. When the electrical potential at the pull-down control node is a high level (i.e., when the electrical potential at the pull-up node is a low level), the second pull-down node control transistor is turned on to control the electrical potential at the pull-down node to be a high level. In actual operations, the first pull-down node control transistor and the second pull-down node control transistor may also be P-type transistors.

Figure 4A:
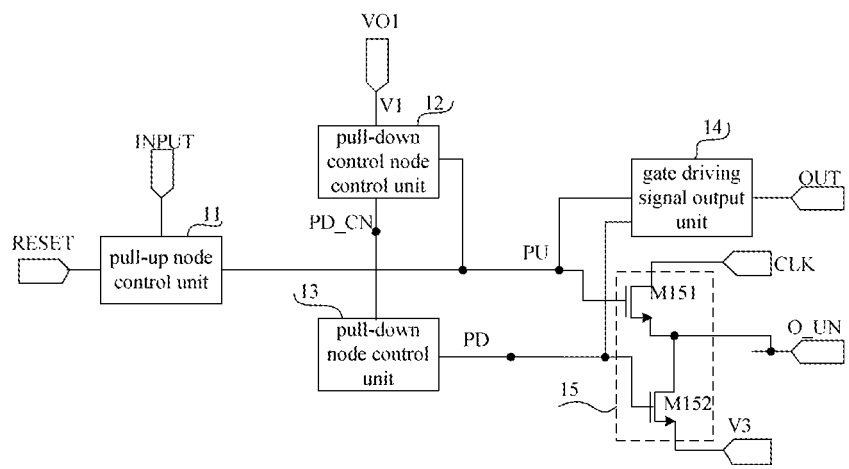
FIG. 4A is a circuit diagram of a shift register unit of at least some embodiments of the present disclosure.

Specifically, as shown in FIG. 4A, the carry signal output unit 15 may include a first carry signal output transistor M151 and a second carry signal output transistor M152.

A gate of the first carry signal output transistor M151 is connected with the pull-up node PU. A first electrode of the first carry signal output transistor M151 is connected with a clock signal input terminal CLK. A second electrode of the first carry signal output transistor M151 is connected with the carry signal output terminal O_UN.

A gate of the second carry signal output transistor M152 is connected with the pull-down node PD. A first electrode of the second carry signal output transistor M152 is connected with the carry signal output terminal O_UN. A second electrode of the second carry signal output transistor M152 receives the third level V3.

In the embodiment shown in FIG. 4A, the transistors M151 and M152 are N-type transistors, and in such a case, V3 is the first low level VGL1. When the electrical potential at the pull-up node PU is a high level, the first carry signal output transistor M151 is turned on, such that the carry signal output terminal O_UN is connected with the clock signal input terminal CLK. When the electrical potential at the pull-down node PD_CN is a high level, the second carry signal output transistor M152 is turned on such that the carry signal output terminal O_UN receives the first low level VGL1. In actual operations, the first carry signal output transistor M151 and the second carry signal output transistor M152 may also be P-type transistors.

Figure 4B:
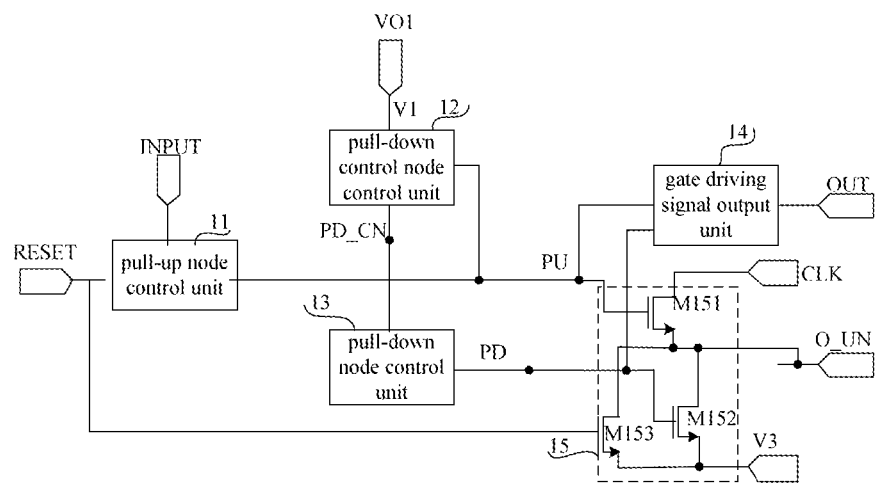
FIG. 4B is a circuit diagram of a shift register unit of at least some embodiments of the present disclosure.

Further, as shown in FIG. 4B, the carry signal output unit may also include a third carry signal output transistor M153. A gate of the third carry signal output transistor M153 is connected with the reset terminal RESET. A first electrode of the third carry signal output transistor M153 is connected with the carry signal output terminal O_UN. A second electrode of the third carry signal output transistor M153 receives the third level V3.

In the embodiment shown in FIG. 4B, the transistor M153 is an N-type transistor, and in such a case, V3 is the first low level VGL1. When the reset signal inputted at the reset terminal RESET has a high level, the third carry signal output transistor M153 is turned on, such that the carry signal output terminal O_UN receives the first low level VGL1. In actual operations, the third carry signal output transistor M153 may also be a P-type transistor.

Figure 5A:
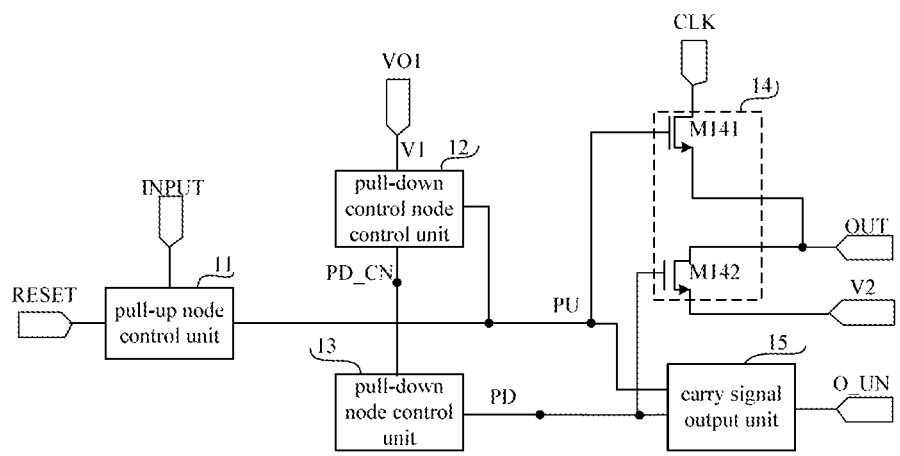
FIG. 5A is a circuit diagram of a shift register unit of at least some embodiments of the present disclosure.

Specifically, as shown in FIG. 5A, the gate driving signal output unit 14 is also connected with the clock signal input terminal CLK. A duty cycle of a clock signal inputted at the clock signal input terminal CLK is smaller than 0.5.

The gate driving signal output unit 14 includes a first gate driving signal output transistor M141 and a second gate driving signal output transistor M142.

A gate of the first gate driving signal output transistor M141 is connected with the pull-up node PU. A first electrode of the first gate driving signal output transistor M141 is connected with the clock signal input terminal CLK. A second electrode of the first gate driving signal output transistor M141 is connected with the gate driving signal output terminal OUT.

A gate of the second gate driving signal output transistor M142 is connected with the pull-down node PD. A first electrode of the second gate driving signal output transistor M142 is connected with the gate driving signal output terminal OUT. A second electrode of the second gate driving signal output transistor M142 receives the second level V2.

In FIG. 5A, both the transistor M141 and the transistor M142 are N-type transistors, and in such a case, the second level V2 may be the second low level VGL2. In actual operations, both the transistor M141 and the transistor M142 may also be P-type transistors.

In the embodiment shown in FIG. 5A, because the duty cycle of the clock signal inputted at the CLK is smaller than 0.5, one gate driving discharging transistor (a gate of this gate driving discharging transistor is connected with the reset terminal, a first electrode of the gate driving discharging transistor is connected with the gate driving signal output terminal, and a second electrode of the gate driving discharging transistor receives the second level) may be saved.

In the embodiment shown in FIG. 5A, the duty cycle of the clock signal inputted at the CLK is set to be smaller than 0.5, and when the electrical potential at the PU is a high level, the M141 is controlled to be turned on and the high level inputted at the CLK is outputted, and the electrical potential at the PU is kept to be high (such a case persists about one clock cycle) until the reset signal is inputted at the RESET. When the duty cycle of the clock signal inputted at the CLK is smaller than 0.5 and when the clock signal inputted at the CLK is changed into a low level, the electrical potential at the PU is still the high level and the transistor M141 is still turned on, the OUT can be discharged to lower its electrical potential to a low level. In this way, the function of the saved discharging transistor is implemented.

Figure 5B:
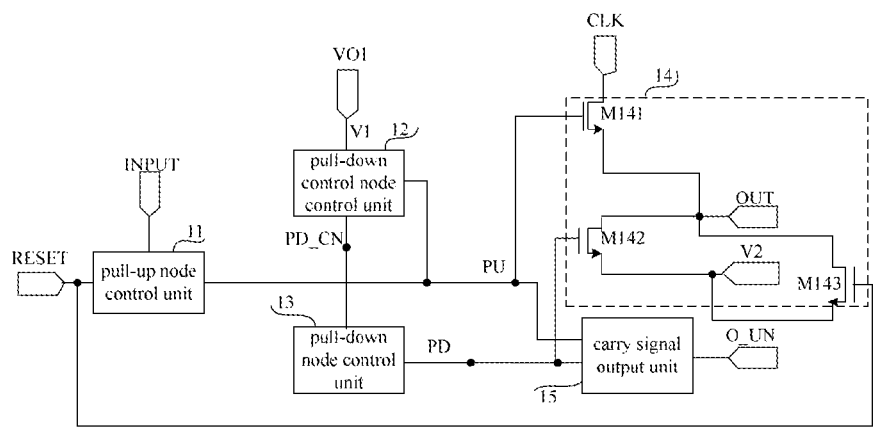
FIG. 5B is a circuit diagram of a shift register unit of at least some embodiments of the present disclosure.

According to another embodiment, as shown in FIG. 5B, the gate driving signal output unit 14 is also connected with the clock signal input terminal CLK.

The gate driving signal output unit 14 includes a first gate driving signal output transistor M141, a second gate driving signal output transistor M142, and a gate driving discharging transistor M143.

A gate of the first gate driving signal output transistor M141 is connected with the pull-up node PU. A first electrode of the first gate driving signal output transistor M141 is connected with the clock signal input terminal CLK. A second electrode of the first gate driving signal output transistor M141 is connected with the gate driving signal output terminal OUT.

A gate of the second gate driving signal output transistor M142 is connected with the pull-down node PD. A first electrode of the second gate driving signal output transistor M142 is connected with the gate driving signal output terminal OUT. A second electrode of the second gate driving signal output transistor M142 receives the second level V2.

A gate of the gate driving discharging transistor M143 is connected with the reset terminal RESET. A first electrode of the gate driving discharging transistor M143 is connected with the gate driving signal output terminal OUT. A second electrode of the gate driving discharging transistor M143 receives the second level V2.

In FIG. 5A, all of the transistors M141, M142, and M143 are N-type transistors, and in such a case, the second level V2 may be the second low level VGL2; in actual operations, all of the transistors M141, M142, M143 may also be P-type transistors.

The embodiment shown in FIG. 5B has one more gate driving discharging transistor M143 as compared to the embodiment shown in FIG. 5A. Therefore, the gate driving signal may be discharged when the reset signal has a high level, and thus even if the duty cycle of the clock signal inputted at the CLK is greater than 0.5, a discharging of the gate driving signal may still be done.

Specifically, an input signal is inputted at the input terminal, and a reset signal is inputted at the reset terminal.

The pull-up node control unit is to control the electrical potential at the pull-up node to be the first level in an input phase under the control of the input signal, control a bootstrapping of the electrical potential at the pull-up node in an output phase, control the electrical potential at the pull-up node to be the third level in a reset phase under the control of the reset signal, and control the electrical potential at the pull-up node to be maintained at the third level in an output cutting-off and keeping phase.

In actual operations, the pull-up node control unit may include an input transistor, a reset transistor, a pull-up node pull-down transistor, and a storage capacitor. Both a gate and a first electrode of the input transistor are connected with the input terminal. A second electrode of the input transistor is connected with the pull-up node. A gate of the reset transistor is connected with the reset terminal RESET. A first electrode of the reset transistor is connected with the pull-up node. A second electrode of the reset transistor receives the third level. A gate of the pull-up node pull-down transistor is connected with the pull-down node. A first electrode of the pull-up node pull-down transistor is connected with the pull-up node. A second electrode of the pull-up node pull-down transistor receives the third level. A first end of the storage capacitor is connected with the pull-up node. A second end of the storage capacitor is connected with the gate driving signal output terminal.

The transistors described in all of the embodiments of the present disclosure may be thin-film transistors or field effect transistors or other devices having similar characteristics. In the embodiments of the present disclosure, in order to distinguish the two electrodes other than the gate of one transistor, one of the two electrodes is referred to as the source electrode, and the other of the two electrodes is referred to as the drain electrode. In addition, according to characteristics of transistors, transistors may be categorized into N-type transistors and P-type transistors. In the driving circuit provided in the embodiments of the present disclosure, all transistors are instantiated by N-type transistors. However, it may be easily considered by one skilled in the art without any creative labor that the transistors of the present disclosure may be replaced by P-type transistors. Such implementation falls into the protection scope of the embodiments of present disclosure.

The shift register unit of the present disclosure will be described hereinafter with a specific example.

Figure 6:
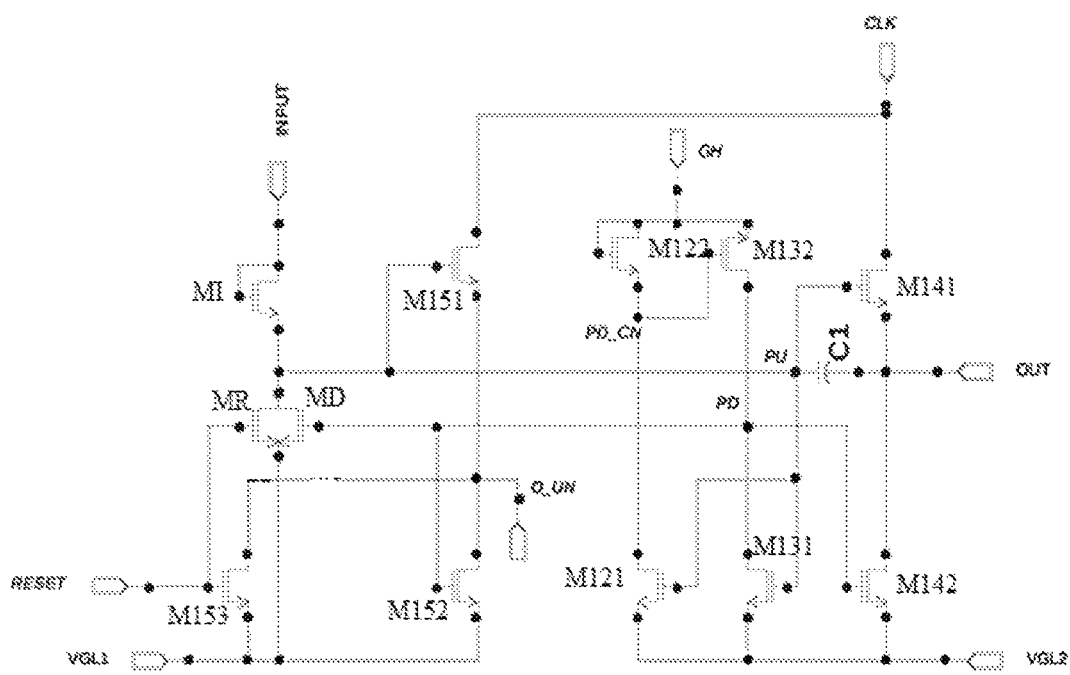
FIG. 6 is a circuit diagram of one example of a shift register unit of the present disclosure.

As shown in FIG. 6, the shift register unit of the present disclosure further includes an input terminal INPUT, a reset terminal RESET, a high level output terminal GH, a carry signal output terminal O_UN and a gate driving signal output terminal OUT. The shift register unit further includes a pull-up node control unit, a pull-down control node control unit, a pull-down node control unit, a gate driving signal output unit and a carry signal output unit.

The pull-up node control unit includes an input transistor MI, a reset transistor MR, a pull-up node pull-down transistor MD and a storage capacitor C1.

Both of a gate electrode and a drain electrode of the input transistor MI is connected with the input terminal INPUT, and a source electrode of the input transistor is connected with the pull-up node PU.

A gate of the reset transistor MR is connected with the reset terminal RESET. A drain electrode of the reset transistor MR is connected with the pull-up node PU. A source electrode of the reset transistor receives the first low level VGL1.

A gate of the pull-up node pull-down transistor MD is connected with the pull-down node PD. A first electrode of the pull-up node pull-down transistor MD is connected with the pull-up node PU. A second electrode of the pull-up node pull-down transistor MD receives the first low level VGL1.

A first end of the storage capacitor C1 is connected with the pull-up node PU. A second end of the storage capacitor C1 is connected with the gate driving signal output terminal OUT.

The pull-down control node control unit includes a first pull-down control node control transistor M121 and a second pull-down control node control transistor M122.

A gate electrode of the first pull-down control node control transistor M121 is connected with the pull-up node PU. A first electrode of the first pull-down control node control transistor M121 is connected with the pull-down control node PD_CN. A second electrode of the first pull-down control node control transistor M121 receives the second low level VGL2.

Both a gate electrode and a first electrode of the second pull-down control node control transistor M122 are connected with the high level output terminal GH. A second electrode of the second pull-down control node control transistor M122 is connected with the pull-down control node PD_CN.

The pull-down node control unit includes a first pull-down node control transistor M131 and a second pull-down node control transistor M132.

A gate electrode of the first pull-down node control transistor M131 is connected with the pull-up node PU. A first electrode of the first pull-down node control transistor M131 is connected with the pull-down node PD. A second electrode of the first pull-down node control transistor M131 receives the second low level VGL2.

A gate electrode of the second pull-down node control transistor M132 is connected with the pull-down control node PD_CN. A first electrode of the second pull-down node control transistor M132 is connected with the high level output terminal GH. A second electrode of the second pull-down node control transistor M132 is connected with the pull-down node PD.

The gate driving signal output unit includes a first gate driving signal output transistor M141 and a second gate driving signal output transistor M142.

A gate electrode of the first gate driving signal output transistor M141 is connected with the pull-up node PU. A first electrode of the first gate driving signal output transistor M141 is connected with the clock signal input terminal CLK. A second electrode of the first gate driving signal output transistor M141 is connected with the gate driving signal output terminal OUT.

A gate electrode of the second gate driving signal output transistor M142 is connected with the pull-down node PD. A first electrode of the second gate driving signal output transistor M142 is connected with the gate driving signal output terminal OUT. A second electrode of the second gate driving signal output transistor M142 receives the second low level VGL2.

The carry signal output unit includes a first carry signal output transistor M151, a second carry signal output transistor M152, and a third carry signal output transistor M153.

A gate electrode of the first carry signal output transistor M151 is connected with the pull-up node PU. A first electrode of the first carry signal output transistor M151 is connected with the clock signal input terminal CLK. A second electrode of the first carry signal output transistor M151 is connected with the carry signal output terminal O_UN.

A gate electrode of the second carry signal output transistor M152 is connected with the pull-down node PD. A first electrode of the second carry signal output transistor M152 is connected with the carry signal output terminal O_UN. A second electrode of the second carry signal output transistor M152 receives the first low level VGL1.

A gate electrode of the third carry signal output transistor M153 is connected with the reset terminal RESET. A first electrode of the third carry signal output transistor M153 is connected with the carry signal output terminal O_UN. A second electrode of the third carry signal output transistor M153 receives the first low level VGL1.

In the specific example of the shift register unit shown in FIG. 6, all transistors are N-type transistors. However, in actual operations, these transistors may also be P-type transistors and the types of these transistors are not limited thereto.

Figure 7:
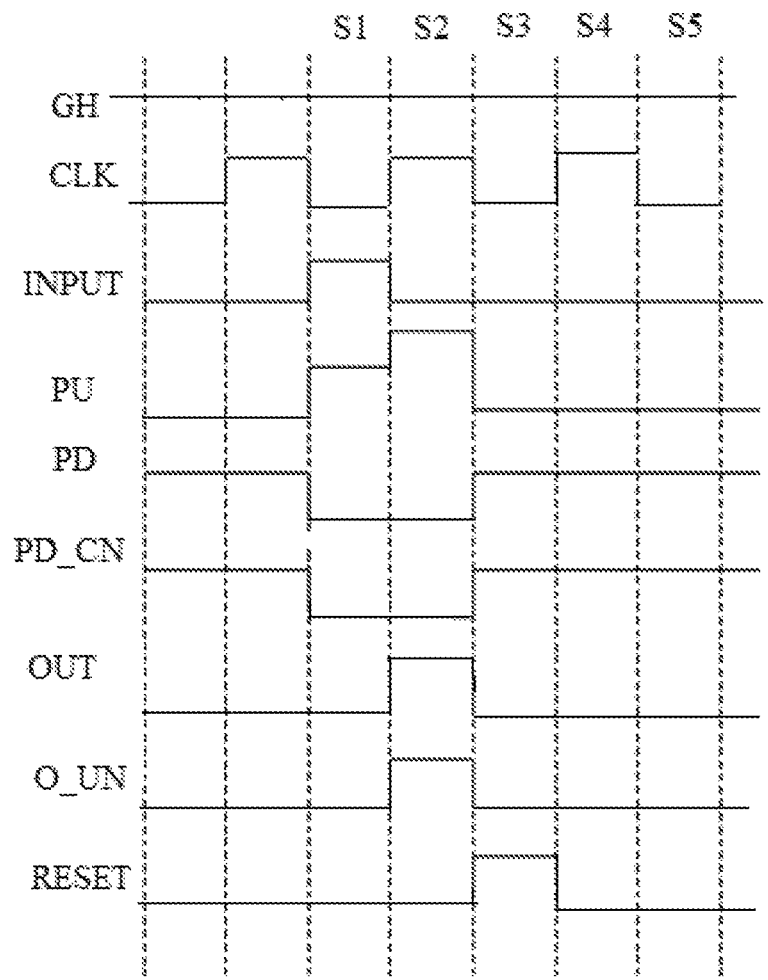
FIG. 7 is a timing diagram of the shift register unit shown in FIG. 6.

As shown in FIG. 7, when the specific example of the shift register unit shown in FIG. 6 is in operation, the duty cycle of the clock signal inputted at the CLK is smaller than 50%, a direct-current high level signal is outputted at the GH, and the VGL1 and the VGL2 are direct-current low level signals.

In a first phase S1, i.e., the input phase, the input terminal INPUT is connected with the carry signal output terminal of the shift register unit in the previous stage. In such a case, a carry signal outputted by the shift register unit in the previous stage has a high level, i.e., an input signal inputted at the input terminal INPUT has a high level, and the MI is controlled to be turned on to charge the Cl, thereby pulling the electrical potential at the PU up in which case the M121 and the M131 are turned on. By adjusting a configuration of the M131, the PD may be discharged and thus the electrical potential at the PD is pulled down, such that the M142 is turned off and the OUT is not discharged any more. At this time, the clock signal inputted at the CLK has a low level and the M141 and the M151 are turned on, causing the OUT and the O_UN to output low levels. A high level is inputted at the GH. By adjusting configurations of the M132, the M131, the M122, and the M121, the electrical potentials at the PD_CN and the PD may be reduced to low levels, so as to ensure stable signal output in the next phase.

In a second phase S2, i.e., the output phase, the input signal inputted at the INPUT has a low level, the MI is turned off, and the electrical potential at the PU continues to be kept at the high level, such that electrical potentials at the PD_CN and the PD are kept to be in the low-level state in the previous phase, thereby ensuring stably outputting the gate driving signal and the carry signal. The M141 and the M151 are turned on, and the clock signal inputted at the CLK is changed to have a high level. Because of a bootstrapping effect of the Cl, the electrical potential at the PU continues to be pulled up, and both the M141 and the M151 are turned on such that high levels are outputted by the OUT and the O_UN.

In a third phase S3, i.e., the reset phase, the reset signal inputted at the RESET has a high level, the GH outputs a high level signal, the clock signal inputted at the CLK has a low level, the input signal inputted at the INPUT has a low level, and the RESET is connected with the carry signal output terminal of the shift register unit in the next stage. The reset signal turns the M153 on to discharge the O_UN, and thus the electrical potential at the carry signal outputted by the O_UN is pulled down to VGL1. At the same time, the reset signal turns the MR on to discharge the PU, and thus the electrical potential at the PU is pulled down and is kept to be a low level, to thereby turn the M141, the M151, the M131 and the M121 off. Because the GH outputs the direct-current high level signal, the electrical potentials at the PD_CN and the PD are pulled up to high levels, so as to turned the M142, the M152 and the MD on to discharge the PU, the O_UN and the OUT. Therefore, the electrical potentials at the PU, the O_UN and the OUT are pulled down to cause the OUT and the O_UN to output low levels.

In a fourth phase S4, the clock signal inputted at the CLK has a high level. In such a case, the M141 and the M151 are turned off, and the clock signal inputted at the CLK cannot be outputted to the OUT and the O_UN, and thus the OUT and the O_UN keep the low level outputs in the previous phase. At the same time, because the electrical potential of the PU continues to be the low level and the electrical potentials at the PD_CN and the PD continue to be the high levels, the M142, the M152 and the MD are normally turned on and the PU and the OUT and the O_UN are discharged continuously, thereby ensuring minimal noise.

In a fifth phase S4, the clock signal inputted at the CLK has a low level. In such a case, the GH outputs the direct-current high level signal, such that the electrical potentials at the PD_CN and the PD continue to be the high levels, to keep the M142 and the M152 and the MD to be normally turned on and discharge the PU and the OUT and the O_UN continuously, thereby ensuring minimal noise.

Thereafter, the fourth phase and the fifth phase are repeated interlacedly, until the high level signal is inputted at the INPUT once more, and the first phase is started once again.

The specific example of the shift register unit shown in FIG. 6 provides an input signal for the shift register unit in the next stage by the carry signal output unit, and uses a separate carry signal output terminal O_UN instead of the gate driving signal output terminal OUT in the related art to charge the shift register unit in the next stage. In such a way, a size of the M141 is decreased, and thus a power consumption of Gate On Array (GOA, or an array substrate row driving circuit) is reduced.

A driving method for the shift register unit of the embodiments of the present disclosure includes:

when an electrical potential at the pull-up node is a first level, controlling, by the pull-down control node control unit, the electrical potential at the pull-down control node to be a second level; when the electrical potential at the pull-up node is a third level, controlling, by the pull-down control node control unit, the pull-down control node to be connected with the first level output terminal;

when an electrical potential at the pull-up node is the first level, controlling, by the pull-down node control unit, the electrical potential of the pull-down node to be the second level; when the electrical potential at the pull-down control node is the first level, controlling, by the pull-down node control unit, the pull-down node to be connected with the first level output terminal;

under the control of the pull-up node and the pull-down node, controlling, by the carry signal output unit, the carry signal output terminal to output a carry signal, and providing, by the carry signal output terminal, an input signal to a shift register unit in an adjacent next stage.

The driving method for the shift register unit of the embodiments of the present disclosure uses the first level output terminal to consistently make the pull-down node to be at the first level (which may control turning on of a transistor for discharging and denoising the pull-up node) in the non-outputting phase, thereby accomplishing discharging and denoising the pull-up node in the non-outputting phase. The shift register unit of the embodiments of the present disclosure is provided with not only the gate driving signal output terminal, but also the carry signal output terminal, so that through the carry signal output terminal, the reset signal may be provided to the shift register unit in the previous stage and the input signal may be provided to the shift register unit in the next stage, and a better charging-discharging effect may be achieved. Further, in the embodiments of the present disclosure, the driving method for the shift register unit employs the carry signal output terminal instead of the gate driving signal output terminal in the related art to provide the input signal to the shift register unit in the next stage, thereby decreasing the size of the output transistor included in the gate driving signal output unit and further reducing the power consumption and size of the whole shift register units and meeting the requirement of a product having low-power consumption and narrow frame.

Specifically, the driving method for the shift register unit of the embodiments of the present disclosure further includes:

in the input phase, controlling, by the pull-up node control unit under the control of the input signal inputted at the input terminal, the electrical potential at the pull-up node to be the first level;

in the output phase, controlling, by the pull-up node control unit, the bootstrapping of the electrical potential at the pull-up node;

in the reset phase, controlling, by the pull-up node control unit under the control of the reset signal inputted at the reset terminal, the electrical potential at the pull-up node to be the third level; and in the output cutting off and keeping phase, controlling, by the pull-up node control unit, the electrical potential at the pull-up node to be maintained at the third level.

Specifically, the step of when the electrical potential at the pull-up node is the first level, controlling, by the pull-down control node control unit, the electrical potential at the pull-down control node to be the second level; when the electrical potential at the pull-up node is the third level, controlling, by the pull-down control node control unit, the pull-down control node to be connected with the first level output terminal includes:

in the input phase and in the output phase, controlling, by the pull-down control node control unit, the electrical potential at the pull-down control node to be the second level; and in the reset phase and in the output cutting-off and keeping phase, controlling, by the pull-down control node control unit, the pull-down control node to be connected with the first level output terminal.

Specifically, the step of when the electrical potential at the pull-up node is the first level, controlling, by the pull-down node control unit, the electrical potential at the pull-down node to be the second level; when the electrical potential at the pull-down control node is the first level, controlling, by the pull-down node control unit, the pull-down node to be connected with the first level output terminal includes:

in the input phase and in the output phase, controlling, by the pull-down node control unit, the electrical potential at the pull-down node to be the second level; and in the reset phase and in the output cutting-off and keeping phase, controlling, by the pull-down node control unit, the pull-down node to be connected with the first level output terminal.

Specifically, the step of under the control of the pull-up node and the pull-down node, controlling, by the carry signal output unit, the carry signal output terminal to output a carry signal, and providing, by the carry signal output terminal, an input signal to a shift register unit in an adjacent next stage includes:

in the input phase and in the output phase, controlling, by the carry signal output unit, the carry signal output terminal to output the clock signal; and in the reset phase and in the output cutting-off and keeping phase, controlling, by the carry signal output unit, the carry signal output terminal to output the third level.

The gate driving circuit of the embodiments of the present disclosure includes multiple stages of the shift register units.

The display device in the embodiments of the present disclosure includes the abovementioned gate driving circuit.

The above are optional embodiments of the present disclosure. It should be understood that one skilled in the art may make improvements and embellishments to the present disclosure without departing from the spirits of the present disclosure. Such improvements and embellishments should be considered to fall into the scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A shift register unit, comprising:
   an input terminal;
   a reset terminal;
   a first level output terminal;
   a carry signal output terminal;
   a gate driving signal output terminal;
   a pull-up node control unit connected with the input terminal, the reset terminal and a pull-up node;
   a pull-down control node control unit connected with the first level output terminal, the pull-up node and the pull-down control node;
   a pull-down node control unit connected with the pull-down control node, the first level output terminal, the pull-up node and the pull-down node;
   a gate driving signal output unit connected with the pull-up node, the pull-down node and the gate driving signal output terminal; and
   a carry signal output unit connected with the carry signal output terminal, the pull-up node and the pull-down node;
   wherein the pull-down control node control unit is configured to control an electrical potential at the pull-down control node to be a second level when an electrical potential at the pull-up node is a first level, and control the pull-down control node to be connected with the first level output terminal when the electrical potential at the pull-up node is a third level;
   wherein the pull-down node control unit is configured to control the electrical potential at the pull-down node to be the second level when the electrical potential at the pull-up node is the first level, and to control the pull-down node to be connected with the first level output terminal when the electrical potential at the pull-down control node is the first level;
   wherein the gate driving signal output unit is configured to control the gate driving signal output terminal to output a gate driving signal, under the control of the pull-up node and the pull-down node; and
   wherein the carry signal output unit is configured to control the carry signal output terminal to output a carry signal, under the control of the pull-up node and the pull-down node, and the carry signal output terminal is configured to provide an input signal to a shift register unit in the adjacent next stage.

2. The shift register unit according to claim 1, wherein the carry signal output unit is further connected with the reset terminal, and is further configured to control the carry signal output terminal to output the third level when a reset signal inputted at the reset terminal has the first level.

3. The shift register unit according to claim 1, wherein the pull-down control node control unit comprises:
   a first pull-down control node control transistor that comprises a gate electrode connected with the pull-up node, a first electrode connected with the pull-down control node, and a second electrode receiving the second level; and
   a second pull-down control node control transistor that comprises a gate electrode connected with the first level output terminal, a first electrode connected with the first level output terminal, and a second electrode connected with the pull-down control node.

4. The shift register unit according to claim 3, wherein the carry signal output unit is further connected with the reset terminal, and is further configured to control the carry signal output terminal to output the third level when a reset signal inputted at the reset terminal has the first level.

5. The shift register unit according to claim 1, wherein the pull-down node control unit comprises:
   a first pull-down node control transistor that comprises a gate electrode connected with the pull-up node, a first electrode connected with the pull-down node, and a second electrode receiving the second level; and
   a second pull-down node control transistor that comprises a gate electrode connected with the pull-down control node, and a first electrode connected with the first level output terminal, and a second electrode connected with the pull-down node.

6. The shift register unit according to claim 5, wherein the carry signal output unit is further connected with the reset terminal, and is further configured to control the carry signal output terminal to output a third level when a reset signal inputted at the reset terminal has the first level.

7. The shift register unit according to claim 1, wherein the carry signal output unit comprises:
   a first carry signal output transistor that comprises a gate electrode connected with the pull-up node, a first electrode connected with a clock signal input terminal, and a second electrode connected with the carry signal output terminal; and
   a second carry signal output transistor that comprises a gate electrode connected with the pull-down node, a first electrode connected with the carry signal output terminal, and a second electrode receiving a third level.

8. The shift register unit according to claim 7, wherein the carry signal output unit is further connected with the reset terminal, and is further configured to control the carry signal output terminal to output a third level when a reset signal inputted at the reset terminal has the first level.

9. The shift register unit according to claim 7, wherein the carry signal output unit further comprises a third carry signal output transistor that comprises a gate electrode connected with the reset terminal, a first electrode connected with the carry signal output terminal, and a second electrode receiving the third level.

10. The shift register unit according to claim 1, wherein the gate driving signal output unit is further connected with a clock signal input terminal;
    a duty cycle of a clock signal inputted at the clock signal input terminal is smaller than 0.5;
    the gate driving signal output unit comprises:
    a first gate driving signal output transistor that comprises a gate electrode connected with the pull-up node, a first electrode connected with a clock signal input terminal, and a second electrode connected with the gate driving signal output terminal; and a second gate driving signal output transistor that comprises a gate electrode connected with the pull-down node, a first electrode connected with the gate driving signal output terminal, and a second electrode receiving the second level.

11. The shift register unit according to claim 1, wherein the gate driving signal output unit is further connected with a clock signal input terminal;
wherein the gate driving signal output unit comprises:
a first gate driving signal output transistor that comprises a gate electrode connected with the pull-up node, a first electrode connected with a clock signal input terminal, and a second electrode connected with the gate driving signal output terminal;
a second gate driving signal output transistor that comprises a gate electrode connected with the pull-down node, a first electrode connected with the gate driving signal output terminal, and a second electrode receiving the second level; and
a gate driving discharging transistor that comprises a gate electrode connected with the reset terminal, a first electrode connected with the gate driving signal output terminal, and a second electrode receiving the second level.

12. The shift register unit according to claim 11, wherein the carry signal output unit is further connected with the reset terminal, and is further used to control the carry signal output terminal to output a third level when a reset signal inputted at the reset terminal has the first level.

13. The shift register unit according to claim 1, wherein an input signal is inputted at the input terminal and a reset signal is inputted at the reset terminal;
wherein the pull-up node control unit is configured to control an electrical potential at the pull-up node to be the first level in an input phase under the control of the input signal, control a bootstrapping of the electrical potential at the pull-up node in an output phase, control the electrical potential at the pull-up node to be a third level in a reset phase under the control of the reset signal, and control the electrical potential at the pull-up node to be maintained at the third level in an output cutting-off and keeping phase.

14. A gate driving circuit, comprising: multiple stages of the shift register unit according to claim 1.

15. A display device, comprising: the gate driving circuit according to claim 14.

16. A method for driving a shift register unit comprises:
when an electrical potential at a pull-up node is a first level, controlling, by a pull-down control node control unit, an electrical potential at a pull-down control node to be a second level;
when the electrical potential at the pull-up node is a third level, controlling, by the pull-down control node control unit, the pull-down control node to be connected with a first level output terminal;
when the electrical potential at the pull-up node is the first level, controlling, by the pull-down node control unit, the electrical potential at the pull-down node to be the second level; when the electrical potential at the pull-down control node is the first level, controlling, by the pull-down node control unit, the pull-down node to be connected with the first level output terminal;
under the control of the pull-up node and the pull-down node, controlling, by a carry signal output unit, a carry signal output terminal to output a carry signal, and providing, by the carry signal output terminal, an input signal to a shift register unit in an adjacent next stage.

17. The method according to claim 16, further comprises:
in an input phase, controlling, by the pull-up node control unit under the control of an input signal inputted at an input terminal, the electrical potential at the pull-up node to be the first level;
in an output phase, controlling, by the pull-up node control unit, a bootstrapping of the electrical potential at the pull-up node;
in a reset phase, controlling, by the pull-up node control unit under the control of a reset signal inputted at a reset terminal, the electrical potential at the pull-up node to be the third level; and
in an output cutting off and keeping phase, controlling, by the pull-up node control unit, the electrical potential at the pull-up node to be maintained at the third level.

18. The method according to claim 17, wherein the step of when the electrical potential at the pull-up node is the first level, controlling, by the pull-down control node control unit, the electrical potential at the pull-down control node to be the second level; when the electrical potential at the pull-up node is the third level, controlling, by the pull-down control node control unit, the pull-down control node to be connected with the first level output terminal comprises:
in the input phase and in the output phase, controlling, by the pull-down control node control unit, the electrical potential at the pull-down control node to be the second level; and
in the reset phase and in the output cutting-off and keeping phase, controlling, by the pull-down control node control unit, the pull-down control node to be connected with the first level output terminal.

19. The method according to claim 17, wherein the step of when the electrical potential at the pull-up node is the first level, controlling, by the pull-down node control unit, the electrical potential at the pull-down node to be the second level; when the electrical potential at the pull-down control node is the first level, controlling, by the pull-down node control unit, the pull-down node to be connected with the first level output terminal comprises:
in the input phase and in the output phase, controlling, by the pull-down node control unit, the electrical potential at the pull-down node to be the second level; and
in the reset phase and in the output cutting-off and keeping phase, controlling, by the pull-down node control unit, the pull-down node to be connected with the first level output terminal.

20. The method according to claim 17, wherein the step of under the control of the pull-up node and the pull-down node, controlling, by the carry signal output unit, the carry signal output terminal to output a carry signal, and providing, by the carry signal output terminal, an input signal to a shift register unit in an adjacent next stage comprises:
in the input phase and in the output phase, controlling, by the carry signal output unit, the carry signal output terminal to output the clock signal; and
in the reset phase and in the output cutting-off and keeping phase, controlling, by the carry signal output unit, the carry signal output terminal to output the third level.

* * * * *